US Patent Number: 5,062,114
Date of Patent: Oct. 29, 1991
Inventor: Norifumi Ito, Kawasaki, Japan
Assignee: Ricoh Company, Ltd., Tokyo, Japan
Appl. No.: 558,483
Filed: Jul. 27, 1990

Foreign Application Priority Data
Jul. 31, 1989 [JP] Japan ............... 1-196715

Int. Cl.⁵ ............... H01S 3/10
U.S. Cl. ............... 372/31
Field of Search ............... 372/29, 31

References Cited
U.S. PATENT DOCUMENTS
4,856,011 8/1989 Shimada et al. ............... 372/31
4,907,236 3/1990 Shimada ............... 372/31

Primary Examiner—James W. Davie
Attorney, Agent, or Firm—Oblon, Spivak, McClelland, Maier & Neustadt

ABSTRACT

An output beam control device for a semiconductor laser included in a scanning apparatus measures a relation between the output beam of a semiconductor laser and the current at two different points with respect to a given temperature. The set current of the laser is calculated on the basis of the measured data.

3 Claims, 7 Drawing Sheets

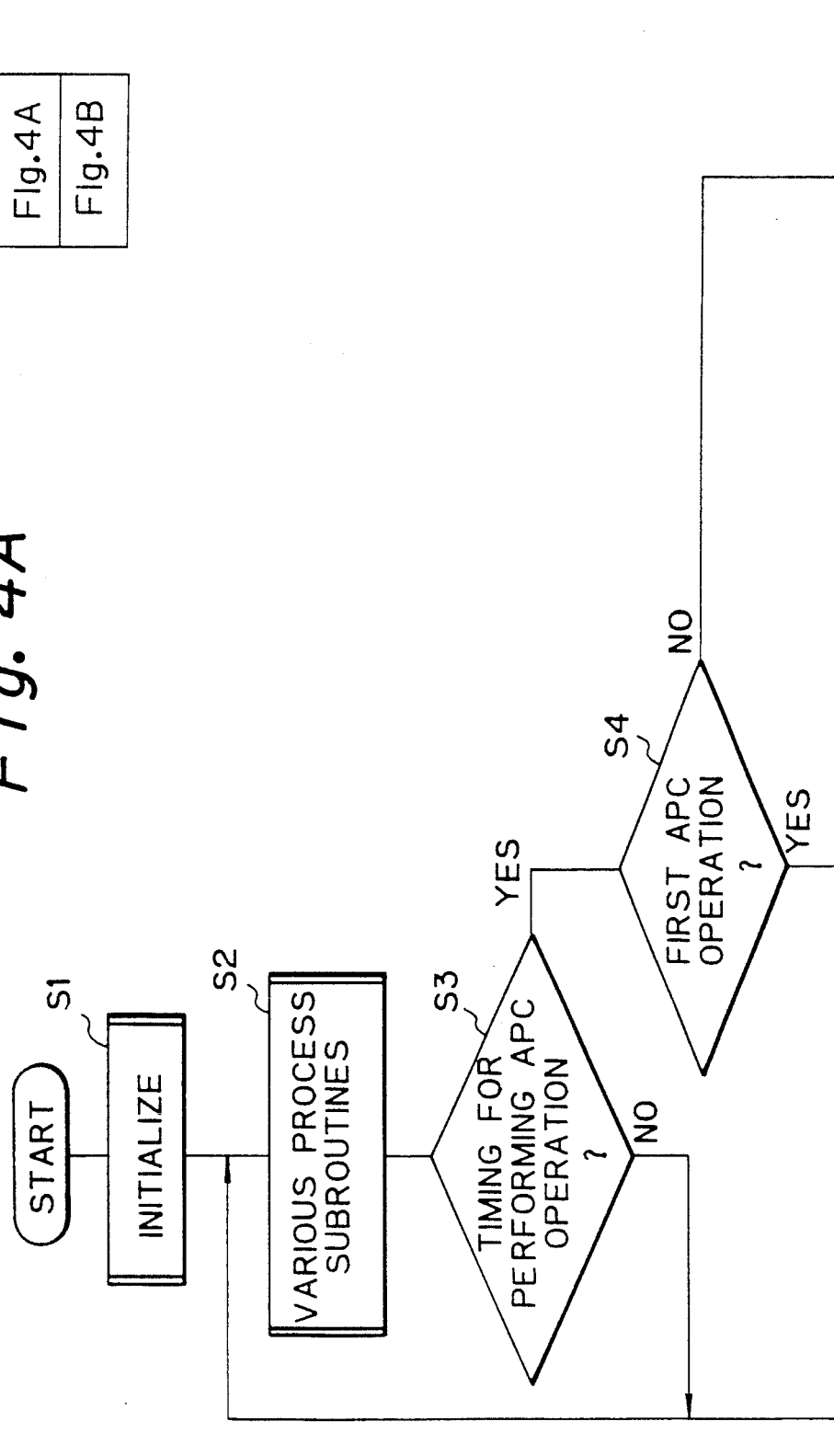

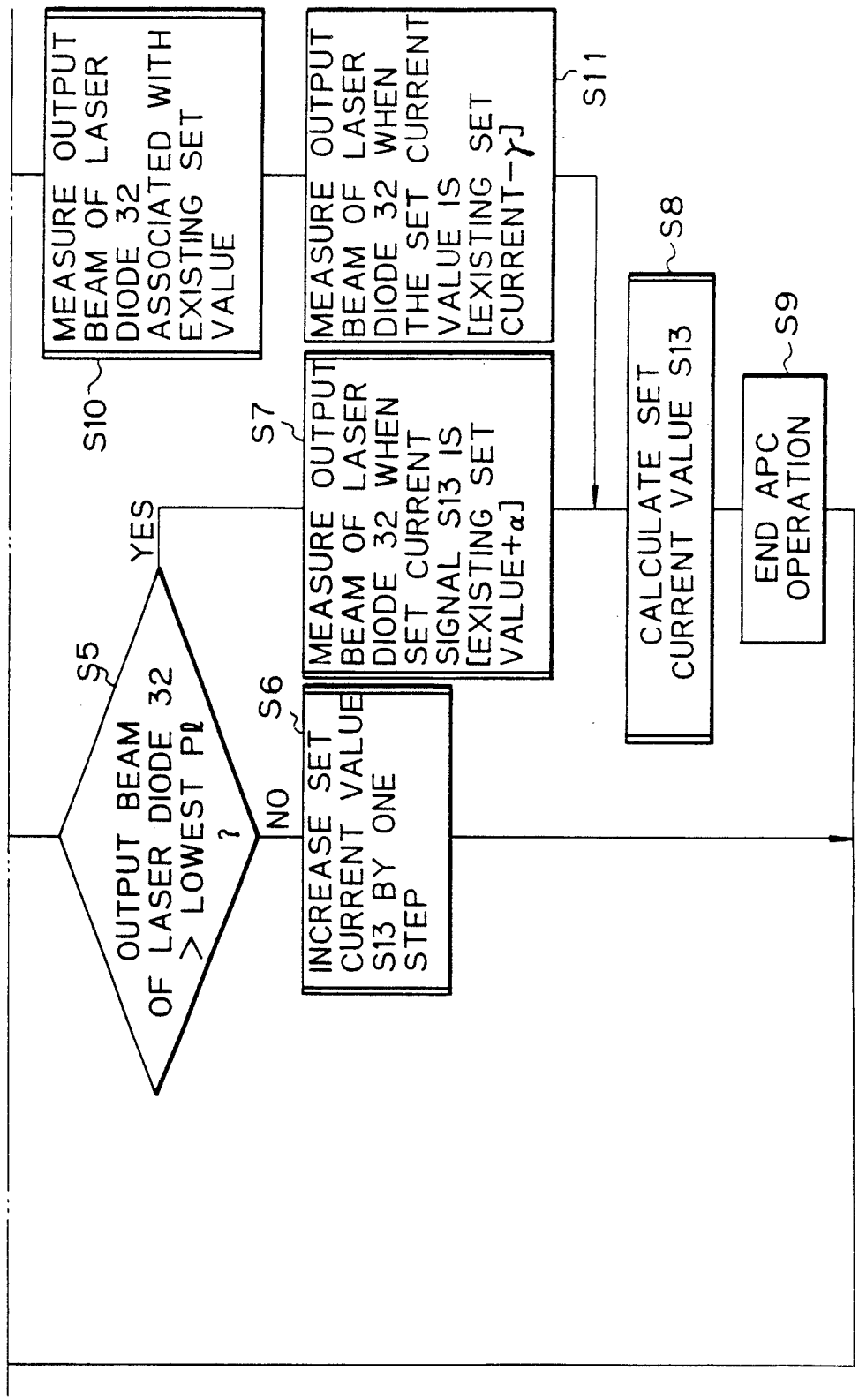

OUTPUT BEAM CONTROL DEVICE FOR A SEMICONDUCTOR LASER

BACKGROUND OF THE INVENTION

The present invention relates to a scanning apparatus of the type using a semiconductor laser as a light source and, more particularly, to a device for controlling the output beam of the semiconductor laser.

A laser beam printer, digital copier or similar image recording apparatus usually includes a scanning device which is implemented with a semiconductor laser. This type of scanning device scans a photoconductive element, or image recording element, with a laser beam having been modulated by image data, whereby a latent image is formed on the photoconductive element. It is necessary, therefore, that the semiconductor laser be stably controlled to emit a constant output beam. However, the output beam of the semiconductor laser, or laser diode (LD), is noticeably dependent on the ambient temeperature as well as to the current fed to the laser diode. To eliminate this problem, the actual output beam of the semiconductor laser may be detected as an electrical signal, e.g., a voltage and compared with a reference value to thereby control a laser driver in such a manner as to maintain the output beam constant, as has been proposed in the past. For example, Japanese Patent Publication No. 54273/1988 discloses an arrangement wherein an up-down counter is incremented when the laser output is lower than a target value or decremented when the former is higher than the latter, thereby controlling the laser output stepwise toward the target value.

The stepwise control scheme mentioned above, however, consumes a substantial period of time until the control of the laser output is completed, since the current fed to the laser diode is increased or decreased stepwise toward the target value.

With an image recording apparatus such as a laser beam printer or a digital copier, it is a common practice to develop a latent image formed on a photoconductive element, or image recording element, by use of a toner. The control of laser output is, therefore, effected with the photoconductive element being charged for protection purposes. Hence, should a substantial period of time be consumed until the end of the control as with the above-stated prior art arrangement, the toner would be unwantedly deposited on the photoconductive element during the course of the control.

SUMMARY OF THE INVENTION

It is therefore an object of the present invention to provide an output beam control device for a semiconductor laser which controls the actual output beam of a semiconductor laser to a target value within a short period of time.

It is another object of the present invention to provide a generally improved output beam control device for a semiconductor laser.

An output beam control device for a semiconductor laser of the present invention comprises a laser diode for emitting an output beam, a driver for driving the laser diode, a photoelectric converting element for generating an analog signal by photoelectrically converting the output beam of the laser diode, an analog-to-digital converting element for converting the analog signal into a digital signal, a controller for determining a rerlation between the output beam of the laser diode and a current applied to the laser diode at two points with respect to a given temperature and, on the basis of the determined relation, calculating a set current value for the laser diode and generating a digital signal representative of the set current value, and a digital-to-analog converting element for converting the digital signal from the control into an analog signal and feeding the analog signal to the driver as the set current value.

BRIEF DESCRIPTION OF THE DRAWINGS

The above and other objects, features and advantages of the present invention will become more apparent from the following detailed description taken with the accompanying drawings in which.

Figure 5:
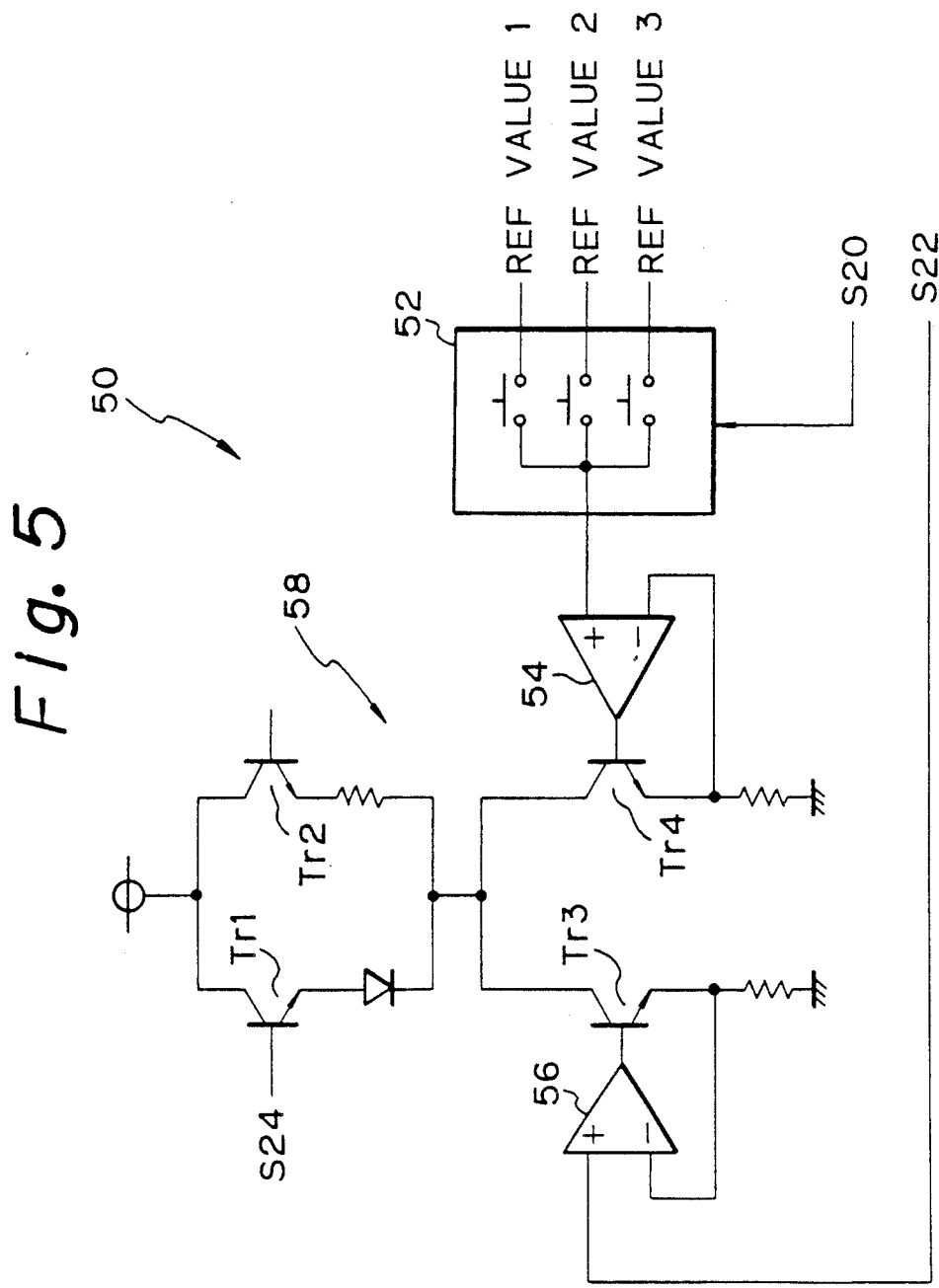
Figure 6:
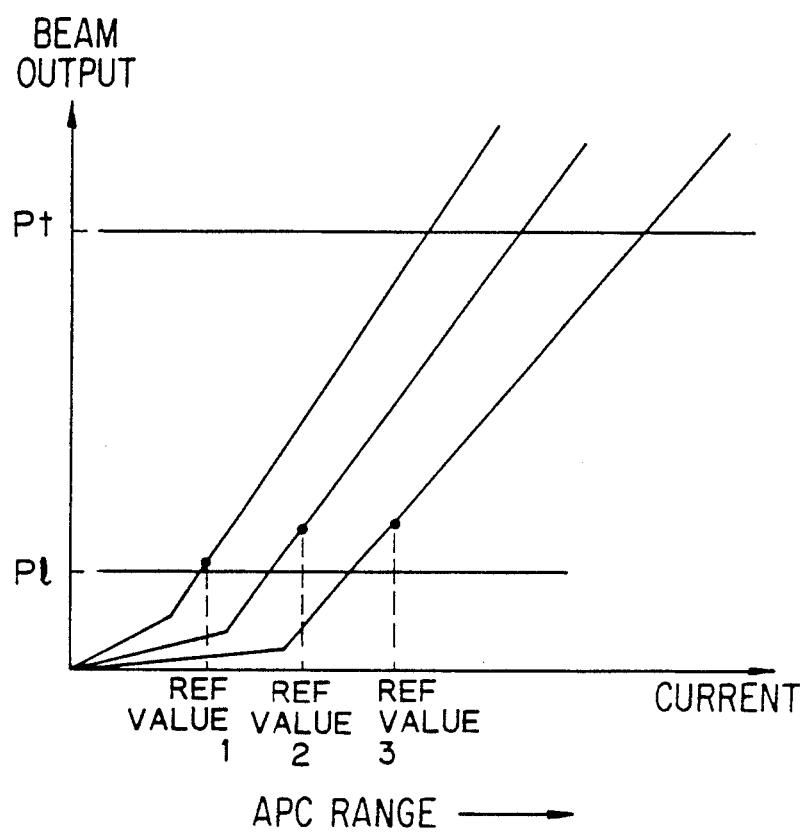

FIG.s 4A and 4B are flowcharts representative of a specific control flow of the illustrative embodiment;

FIG. 5 is a block diagram schematically showing an offset current output circuit; and FIG. 6 is a graph showing a relation between the reference values which an analog switch may select and the set current values.

DESCRIPTION OF THE PREFERRED EMBODIMENT

Figure 1:
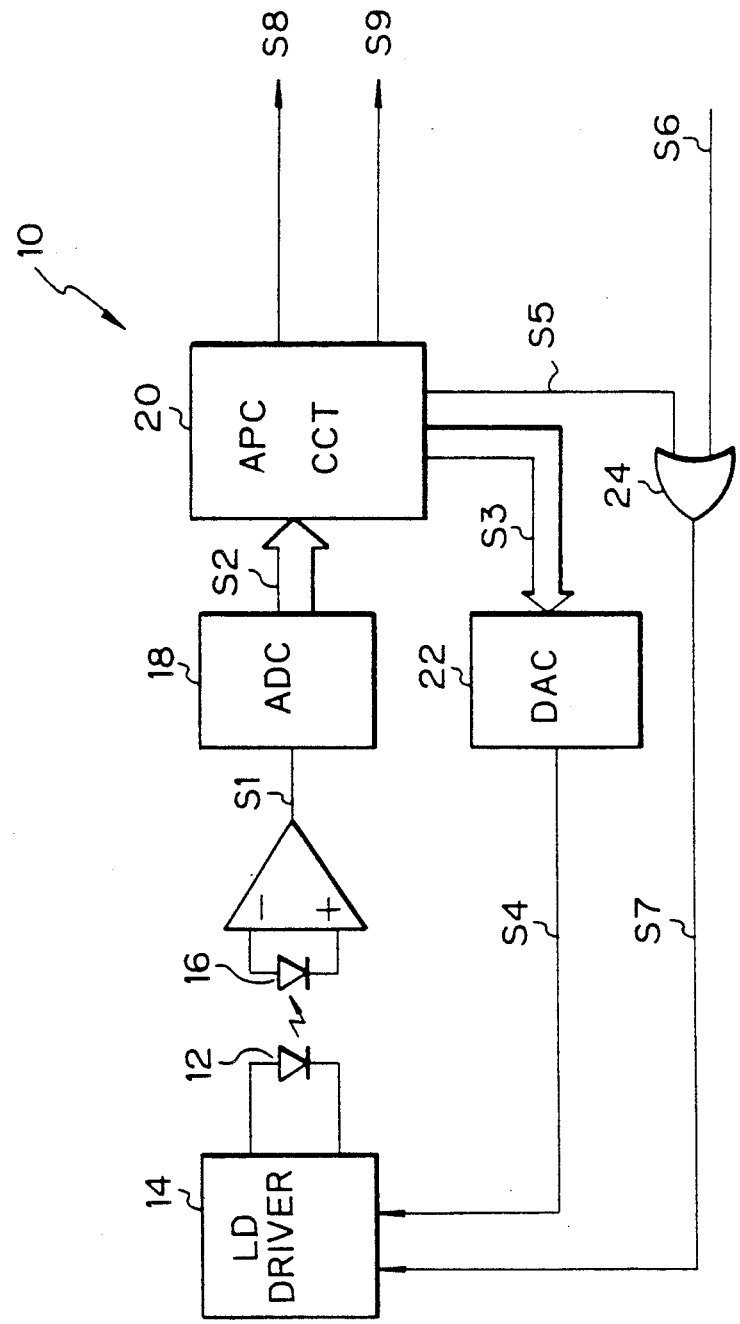
FIG. 1 is a block diagram schematically showing a prior art output beam control device for a semiconductor laser.

To better understand the present inveniton, a brief reference will be made to a prior art output beam control device for a semiconductor laser, shown in FIG. 1. The control device, generally 10, has a semiconductor laser or laser diode (LD) 12 which serves as a light source, a LD driver 14, a photodiode 16, an analog-to-digital converter (ADC) 18, an automatic output control (APC) circuit 20, a digital-to-analog converter (DAC) 22, and an OR gate 24.

Figure 2:
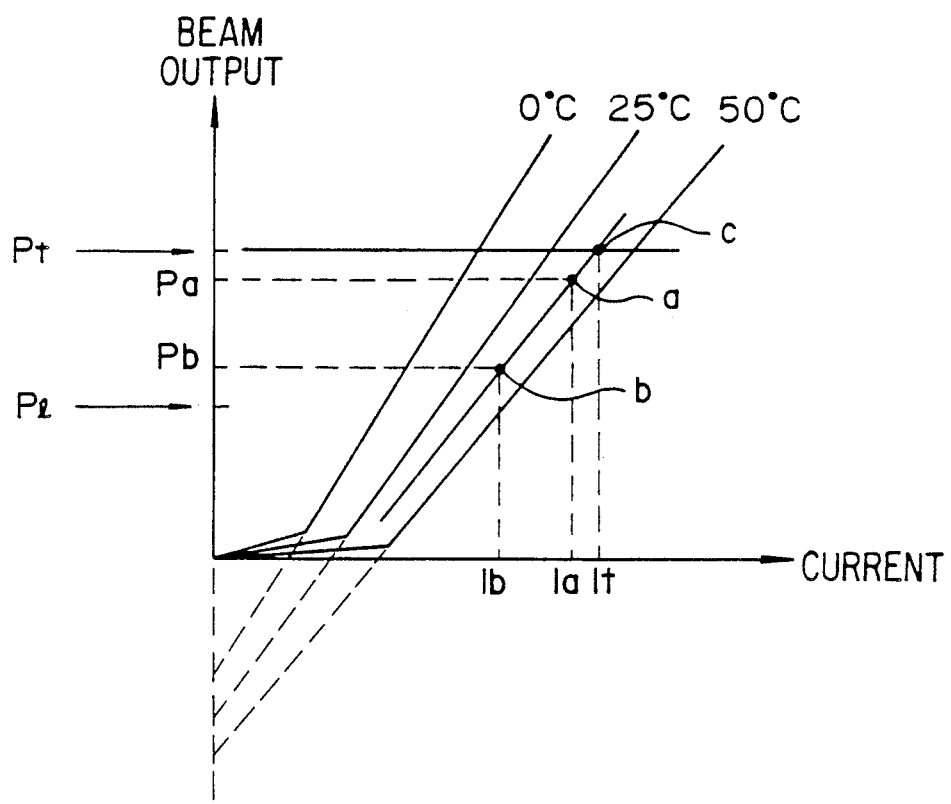
FIG. 2 is a graph indicating the output characteristic of a semiconductor laser or laser diode.

A beam issuing from the laser diode 12 is photoelectrically converted by the photodiode 16 and then fed as an analog signal S1 to the ADC 18. The resulting output of the ADC 18, i.e., a digital signal S2 is applied to the APC circuit 20. As a result, the APC circuit 20 feeds a digital signal S3 to the DAC 22. The DAC 22, in turn, delivers to the LD driver 14 a set current signal S4 for controlling the current which flows through the laser diode 12. The APC 20 feeds an analog signal S5 to one input terminal of the OR gate 24. Fed to the other input terminal of the OR gate 24 is an image signal S6. In response, the OR gate 24 delivers on ON/OFF signal S7 for turning on and off the laser diode 12 to the laser driver 14. Based on the input signals S4 and S7, the LD driver 14 turns on and off the laser diode 12 while maintaining the current flowing therethrough constant. The APC circuit 20 further produces an error signal S8 and an end-of-APC signal S9. FIG. 2 indicates the output characteristic of an ordinary laser diode. As shown, the output beam Y of laser diode is proportional to the current X applied thereto so long as the ambient temperature is constant. Hence, the output beam Y and the current X have a particular relationship which may be expressed as:

$$Y = \alpha X + \beta \qquad \text{Eq. (1)}$$

where $\alpha$ and $\beta$ are the gradient of a line and a constant, respectively.

Paying attention to the fact that the Eq. (1) is a linear equation, the present invention measures the relation between the output beam and the current at two different points with respect to a given temperature and, based on the two measured data, determines the previously mentioned set current signal S4. While this may be implemented with an arithmetic circuit or a timing circuit, a control circuit constituted by a CPU will be more advantageous from the simple construction standpoint.

Figure 3:
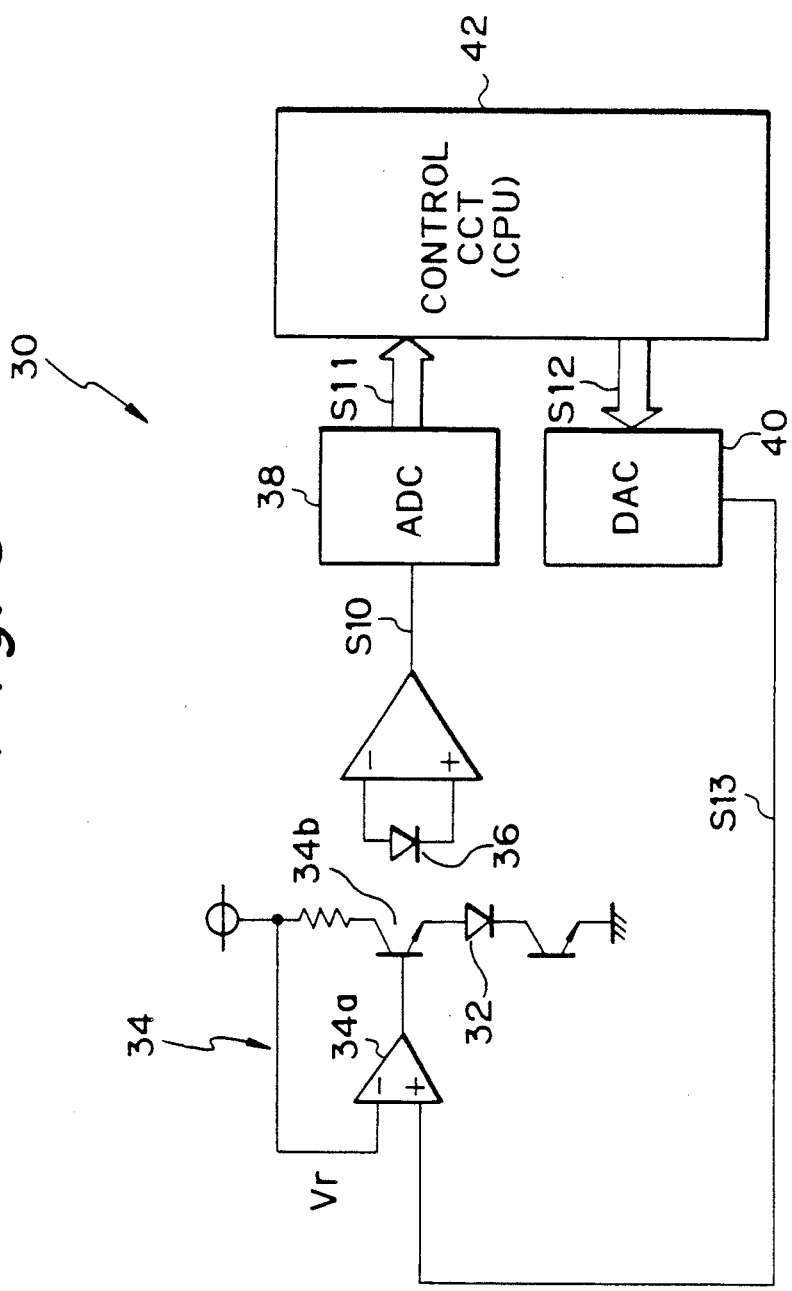
FIG. 3 is a block diagram schematically showing an output beam control device for a semiconductor laser embodying the present invention.

Referring to FIG. 3, an output beam control device for a semiconductor laser embodying the present invention is shown and generally designed by the reference numberal 30. The control device 30 has a semiconductor laser or laser diode (LD) 32. In this illustrative embodiment, a LD driver 34 is made up of a comparator 34a and a driver 34b. A reference voltage Vr is applied to the negative input terminal of the comparator 34a. The control device 30 further has a photodiode 36, an ADC 38, a DAC 40, and a control circuit 42 implemented as a CPU. The output beam of the laser diode 32 is photoelectrically converted by the photodiode 36 into an analog signal S10. On receiving the analog signal S10, the ADC 38 transforms it into a digital signal S11 and applies the signal S11 to the control circuit or CPU 42. The CPU 42 performs arithmetic operations with the digital signal S11 and delivers the result to the DAC 40 as a digital signal S12. In response, the DAC 40 converts the digital signal S12 into an analog signal (voltage) S13. The analog signal S13 is fed to the other input terminal of the comparator 34a of the LD driver 34 as a set current signal. The current flowing through the laser diode 32 is maintained constant on the basis of the result of comparison between the voltage S13 and the reference voltage Vr.

FIGS. 4A and 4B are flowcharts representative of a specific operation of the illustrative embodiment. The arithmetic operations performed by the CPU 42 as mentioned above will be described with reference to FIGS. 4A and 4B.

As shown, the procedure begins with initialization (step S1) and various processing subroutines (S2). Then, the CPU 42 determines whether or not the timing for an APC operation has been reached (step S3) and, if the answer is YES, whether or not the APC operation of interest is the first APC operation (step S4). If the answer of the step S4 is YES, meaning that the power source has just been turned on, the CPU 42 determines whether or not the output beam of the laser diode 32 has exceeded a set value different from the target value Pt shown in FIG. 2, i.e., the smallest value Pl (step S5). If the answer of the step S5 is NO, the CPU 42 increases the set current value S13 by one step (step S6). When the output beam has exceeded the smallest value Pl (YES, step S5), [existing set value $+\alpha$] is delivered as the set current value S13 and the output beam of the laser diode 32 of that time is measured (step S7). Let $\alpha$ be an optimum value determined beforehand. By such a measurement, the CPU 42 obtains data at two different points in FIG. 2 and, then, calculates the set current value S13 necessary for controlling the output beam of the laser diode 32 to the target value Pt (step S8). The CPU 42 completes the APC operation by ouputting the result of calculation (step S9). On the other hand, if the answer of the step S4 is NO, meaning that the APC operation is the second or any other successive APC operation, the CPU 42 measures the output beam of the laser diode 32 associated with the existing set value (measurement at the first point) (step S10). Subsequently, the CPU 42 measures the output beam of the laser diode 32 associated with [existing set value $-\gamma$] (measurement at the second point) (step S11). It is to be noted that when $\gamma$ is greater than [existing set value − lowest set output], the output beam of the laser diode 32 associated with [existing set value $+\gamma$] will be measured in the step S11. This is followed by the steps S8 and S9, as in the first APC operation.

The specific procedure stated above will be described in more detail with reference to FIG. 2 as well.

As shown in FIG. 2, assume that the currents X associated with two points of measurement a and b are respectively Ia and Ib, and that the output beams Y at the points a and b are respectively Pa and Pb. Then, the current It necessary for the output beam Y to reach the target value (constant) Pt as measured at a point c is produced as follows.

From the Eq. (1), $$Pa = \alpha \times Ia + \beta \qquad \text{Eq. (2)}$$

$$Pb = \alpha \times Ib + \beta \qquad \text{Eq. (3)}$$

By substracting the Eq. (3) from the Eq. (2), $$\alpha = \frac{Pa - Pb}{Ia - Ib} \qquad \text{Eq. (4)}$$

By substituting the Eq. (4) for the Eq. (2), $$\beta = \frac{Ia \times Pb - Ib \times Pa}{Ia - Ib} \qquad \text{Eq. (5)}$$

From the Eq. (1)

$$Pt = \alpha \times It + \beta \qquad \text{Eq. (6)}$$

By substituting the Eqs. (4) and (5) for the Eq. (6), $$It = \frac{(Ia - Ib) \times Pt + Ib \times Pa - Ia \times Pb}{Pa - Pb} \qquad \text{Eq. (7)}$$

In the above Eq. (7), the term $(Ia-Ib) \times Pt$ is a constant since $Ia-Ib$ is representative of the variation $\gamma$ which is shown in the steps S7 and S11, FIG. 4. It follows that It of Eq. (7) is obtainable with $Ib \times Pa$, $Ia \times Pb$, $Pa-Pb$, and division. Although the arithmetic circuit for executing such multiplications and divisions is somewhat complicated in construction, it can be readily implemented with a modern CPU.

FIG. 5 schematically shows an offset current output circuit 50 provided independently of the DAC 40 for the purpose of enchancing the accuracy of the set curent signal S13. Specifically, the offset current output circuit 50 produces an offset current. As shown in FIG. 5, the offset current output circuit 50 has an analog switch 52 for selecting reference values 1, 2 and 3 one at a time in response to a select signal S20, comparators 54 and 56, and a driver 58 made up of transistors Tr1, Tr2, Tr3, and Tr4. A set current signal S22 is applied to one input terminal of the comparator 56, while an ON/OFF singal S24 is fed to the base of the transistor Tr1.

Customarily, a set current value has been produced by incrementing or decrementing a digital amount and therefore the current value to be varied by one step has been determined by the amount of data, i.e., the number of bits used. Specifically, assume that the set current value is variable over I between the minimum and maximum values, and that the amount of data is eight bits as usual. Then, the variation in current per step is $\Delta I = I/256$. On the other hand, if the amount of the data is ten bits, then the variation per step is $\Delta I = I/1024$ which will promote more minute control. This, however, brings about a problem that the DAC becomes expensive. In contrast, the means for setting an offset current and provided independently of the DAC adapted for APC operations is successful in enhancing accuracy even with the conventional eight bits of data. Specifically, in the step S6 shown in FIG. 4B, the analog switch 52 sequentially selects the reference current values, the smallest one being first, and the setting operation is completed when the output beam has exceeded the smallest value P1 shown in FIG. 6. This is a substitute for the step-by-step increase in current otherwise executed in the step S6. Then, only if an arrangement is made such that the laser diode surely emits a beam at the reference value 1, for example, within a temperature range in which the laser diode is used in practice, the variation in current in the control system will be reduced by the amount coresponding to the reference value 1. Hence, more accurate control is achievable with the same amount of data, i.e. eight bits.

In summary, in accordance with the present invention, a relation between the output beam of a semiconductor laser and the current is measured at two different points with respect to a given temperature, and the set current of the laser is calculated on the basis of the measured data. The control operation is, therefore, completed within a short period of time corresponding to only two steps.

Various modifications will become possible for those skilled in the art after receiving the teachings of the present disclosure without departing from the scope thereof.

What is claimed is:

1. An output beam control device for a semiconductor laser, comprising:
   a laser diode for emitting an output beam;
   drive means for driving said laser diode;
   photoelecric converting means for generating an analog signal by photoelectrically converting the output beam of said laser diode;
   analog-to-digital converting means for converting the analog signal into a digital signal;
   control means for determining a relation between the output beam of said laser diode and a current applied to said laser diode at two different points on a linear portion of an output characteristic of said laser diode with respect to a given temperature and, on the basis of said determined relation, calculating a set current value for said laser diode and generating a digital signal representative of said set current value; and
   digital-to-analog converting means for converting the digital signal from said control means into an analog signal and feeding said analog signal to said drive means as the set current value.

2. A device as claimed in claim 1, wherein said control means calculates the set current value such that during a first output beam control operation which occurs immediately after a turn-on of said semiconductor laser, the set current value is sequentially increased, the output beam of said laser diode being measured when said set current value has exceeded a threshold, value of said laser diode, whereby the set current value of said laser diode is calculated on the basis of the data associated with the two points.

3. A device as claimed in claim 2, wherein said control means calculates the set current value such that during each of a second and successive output beam control operations, the output beam of said laser diode associated with an existing current value which defines a first point of measurement is measured and the output beam of said laser diode associated with a different current value which defines a second point of measurement is measured, whereby the set current value for said laser diode is calculated on the basis of data associated with said first and second points of measurement.

* * * * *